United States Patent [19]

Chen et al.

[11] Patent Number: 5,233,135

[45] Date of Patent: Aug. 3, 1993

[54] INTERCONNECT FOR INTEGRATED CIRCUITS

[75] Inventors: Fusen E. Chen, Dallas; Frank R. Bryant, Denton; Girish A. Dixit, Dallas, all of Tex.

[73] Assignee: SGS-Thomson Microelectronics, Inc., Carrollton, Tex.

[21] Appl. No.: 722,702

[22] Filed: Jun. 28, 1991

[51] Int. Cl.$^5$ ............................................. H05K 1/00
[52] U.S. Cl. .................................... 174/262; 174/264; 361/784
[58] Field of Search ............... 174/250, 255, 256, 257, 174/258, 262, 264; 357/54

[56] References Cited

U.S. PATENT DOCUMENTS 3,967,371 7/1976 Croset et al. .
4,663,497 5/1987 Reimann .
5,000,818 3/1991 Thomas et al. .
5,103,282 4/1992 Isomura et al. .

Primary Examiner—Leo P. Picard
Assistant Examiner—Cheryl Figlin
Attorney, Agent, or Firm—Kenneth C. Hill; Lisa K. Jorgenson; Richard K. Robinson

[57] ABSTRACT

A technique for forming metal interconnect signal lines provides for planarization of an interlevel dielectric layer. A thin layer of material which can function as an etch stop, such as a metal oxide, is formed over the interlevel dielectric. An alignment process is used to pattern and define openings through the etch stop layer where contacts to underlying conductive regions will be formed. Another insulating layer is formed over the etch stop layer, and patterned to define all interconnect signal lines. When the signal line locations are etched away, the etching process stops on the etch stop layer in regions where the signal lines will be, and continues through to the underlying conductive layer where contacts are needed. A metal refill process can be used to then form interconnects and contacts within the etched holes, followed by an anisotropic etchback to remove any metal which lies on top of the upper insulating layer. This results in interconnect and contacts having upper surfaces which are substantially coplanar with the upper insulating layer in which they are formed.

20 Claims, 3 Drawing Sheets

INTERCONNECT FOR INTEGRATED CIRCUITS

BACKGROUND OF THE INVENTION

1. Field of the Invention

The present invention relates generally to integrated circuits, and more specifically to a technique for forming metal interconnect lines on integrated circuits.

2. Description of the Prior Art

As integrated circuit devices become more complex, greater numbers of interconnect levels are required to connect the various portions of the device. Complex devices are being designed which have two or more levels of polycrystalline silicon interconnect, followed by one or more levels of metal interconnect. When multiple layers of interconnect are used in this manner, difficulties are encountered in forming upper interconnect levels because of uneven topographical features caused by lower interconnect levels. Thus, topography of interconnect layers affects the ease of manufacturing of the integrated circuit device.

In order to make forming upper interconnect levels easier, planarization of lower interconnect levels is routinely performed. Typically, a layer of material such as a reflow glass or spin on glass can be used as part of an interlevel dielectric layer. These materials, when applied properly, have an upper surface which is smoother and more nearly planar than the topography of the underlying surface. This allows the roughness caused by underlying interconnect layers to be smoothed out somewhat prior to the formation of the next layer of interconnect. This next layer of interconnect is then formed on top of the planarized interlevel dielectric layer. Even with this technique, step coverage problems exist since formation of the interconnect layer on the planarized dielectric layer generates uneven topographical features for the next dielectric layer, requiring further planarization. In addition, the planarization improves the flatness of the surface, but does not completely eliminate hills and valleys caused by underlying topographical features.

Various other techniques have been used in the past in an attempt to planarize interconnect as much as possible. One such technique is shown, for example, in U.S. Pat. No. 4,508,815, issued to Ackmann, et al, entitled RECESSED METALIZATION. In this patent, a lift off technique is used to form signal lines which are already somewhat recessed within an oxide layer. This is done is an attempt to improve planarity of the overall device. However, such techniques are difficult to use, and there can be some reliability problems with the resulting product.

It would be desirable for a technique for forming metal interconnect lines to provide such interconnect which is very nearly planar on its upper surface. It is desirable for such a technique to be compatible with present day manufacturing processes, and be relatively simple to use. It is important that such a process provide metal signal lines which are free of voids and other defects.

SUMMARY OF THE INVENTION

Therefore, according to the present invention, an improved technique for forming metal interconnect signal lines provides for planarization of an interlevel dielectric layer. A thin layer of material which can function as an etch stop, such as a metal oxide, is formed over the interlevel dielectric. An alignment process is used to pattern and define openings through the etch stop layer where contacts to underlying conductive regions will be formed. Another insulating layer is formed over the etch stop layer, and patterned and etched to define all interconnect signal lines. When the signal line locations are etched away, the etching process stops on the etch stop layer in regions where the signal lines will be, and continues through to the underlying conductive layer where contacts are needed. A metal refill process can be used to then form interconnects and contacts within the etched holes, followed by an anisotropic etchback to remove any metal which lies on top of the upper insulating layer. This results in interconnect and contacts having upper surfaces which are substantially coplanar with the upper insulating layer in which they are formed.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
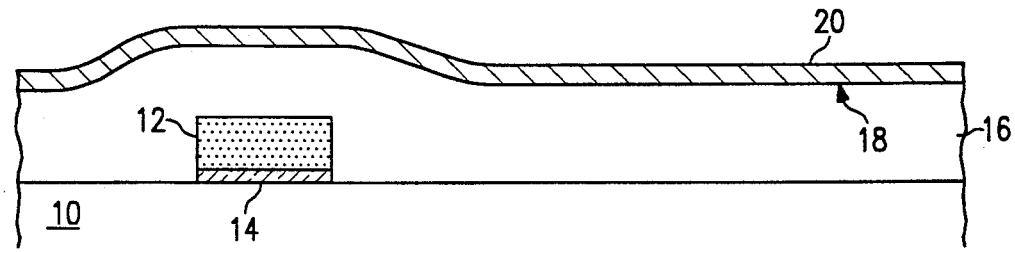
FIGS. 1-6 illustrate a method for forming metal interconnect and contact regions according to the present invention.

Referring to FIG. 1, interconnect is to be formed over an underlying region 10 of an integrated circuit. This underlying region 10 can be a substrate, or can represent underlying layers of interconnect as well. Underlying region 10 contains conductive structures (not shown) to which contact needs to be made from an upper interconnect level to be formed in accordance with the present invention A polycrystalline silicon signal line 12 is formed over the underlying region 10. If the underlying region 10 is a substrate, a gate oxide layer 14 may be formed under the polycrystalline silicon line 12 as part of earlier processing. The polycrystalline silicon signal line 12 can be silicided to improve conductivity as known in the art.

An interlevel dielectric layer 16 is formed over the signal line 12 in the underlying region 10. This layer is typically formed from multiple layers, such as a thin conformal oxide layer and a planarization layer containing reflowed glass or spin on glass. The upper surface 18 of interlevel dielectric layer 16 is typically more planar than the underlying features. Processing of the device to this point is in conformance with principles known in the art.

A metal oxide layer 20 is then deposited over the surface of the interlevel dielectric layer 16. Metal oxide layer 20 can be formed from any material which is an electrical insulator. In addition, it should be chosen such that it may be selectively etched over the oxide used for the underlying interlevel dielectric 16, and oxide should be selectively etchable over the material of the layer 20. In other words, layer 20 acts as an etch stop for etching oxide. Materials suitable for use for the layer 20 are metal oxides such as tantalum oxide, and other selectively etchable materials with insulator behavior.

Figure 2:
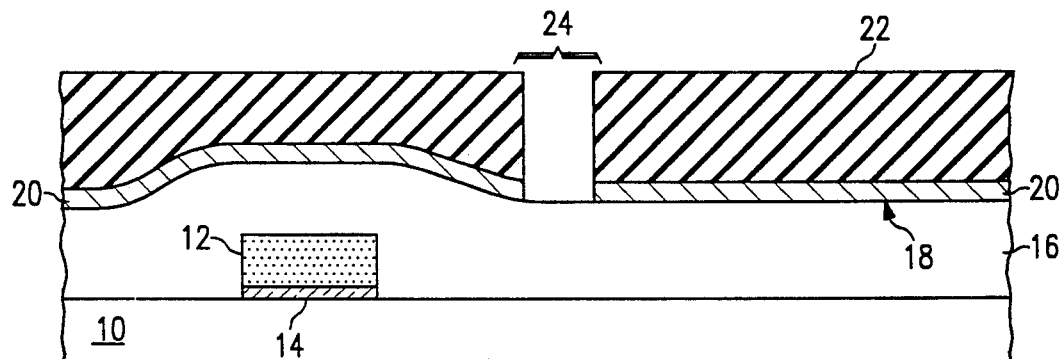

Referring to FIG. 2, a layer of photoresist 22 is applied to the device. The photoresist 22 is patterned as known in the art, defining a region 24 in which a contact is to be made to the underlying region 10. The exposed portion of the metal oxide layer 20 within the contact region 24 is then etched away without removing significant portions of the underlying interlevel dielectric layer 16.

Figure 3:
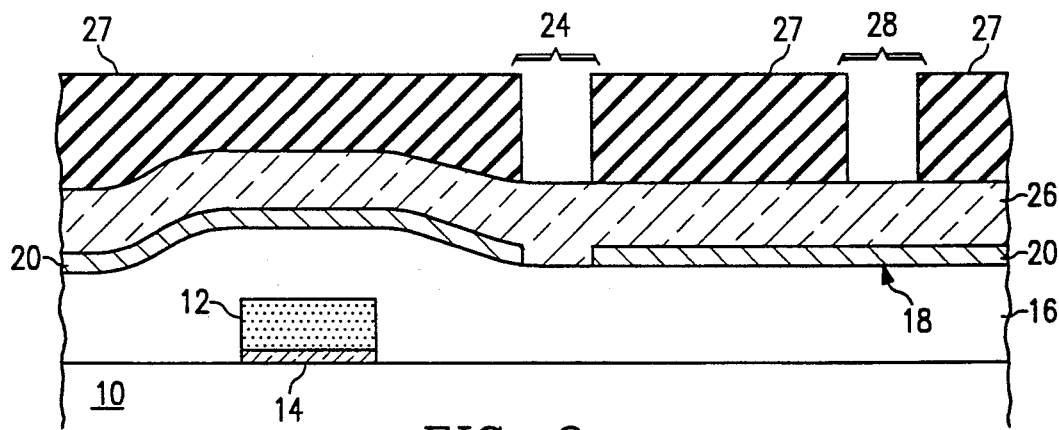

Referring to FIG. 3, a conformal layer of interlevel oxide 26 is applied to the device, followed by a layer of photoresist 27. The photoresist 27 is patterned to define the metal interconnect to be formed. Metal interconnect only will be formed in the opening 28 defined by the photoresist. Opening 24 is again made in the same photoresist layer to align with the previous opening made in the metal oxide layer 20, and a contact will be formed here. As will be appreciated by those skilled in the art, misalignment of the opening 24 in the photoresist layer 26 is not critical unless it is such a gross misalignment as to almost entirely miss the opening made in the metal oxide layer 20.

Figure 4:
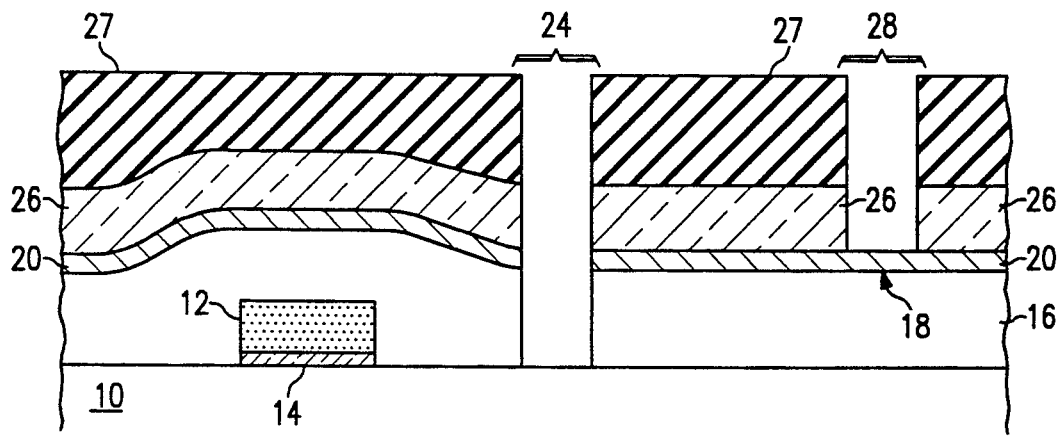

Referring to FIG. 4, the photoresist layer 27 is used as a mask for an anisotropic oxide etch. This removes portions of the oxide layer 26 within the opening 28 down to the metal oxide layer 20. No further etching is performed within opening 28 since the layer 20 acts as an etch stop.

Within the opening 24, etching continues all the way through the interlevel dielectric layer 16 to the underlying region 10 since there is no etch stop on the upper surface 18 within the opening 24. Misalignment of the opening 24 in the photoresist layer shown in FIG. 4 will not adversely impact the device, since etching through the interlevel dielectric layer 16 will not occur beyond the bounds of the opening in the metal oxide layer 20.

Figure 5:
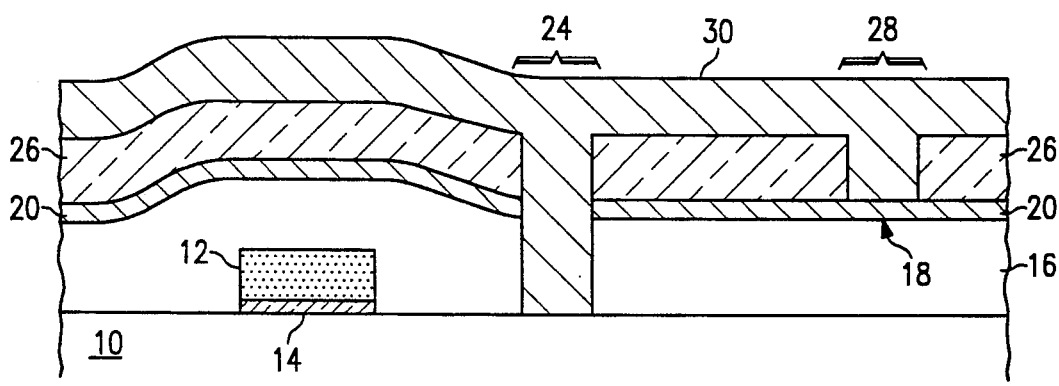

Referring to FIG. 5, a layer of aluminum 30, or other metal suitable for interconnect, is formed over the surface of the device. This metal is deposited in such a manner as to cause it to completely fill the openings 24, 28 within the oxide layer 26. When the aluminum 30 is applied properly, it will completely fill the openings 24, 28 to a significant depth, and provide a complete upper portion which has approximately the same thickness over the openings 24, 28 as it does over the remaining portions of the oxide layer 26. One technique for depositing aluminum in such a manner is described in connection with the formation of aluminum contacts in NOVEL SUBMICRON ALUMINUM CONTACT FILLING TECHNOLOGY FOR ULSI METALLIZATION, C. Yu et al, VMIC Proceedings, p. 199, 1991.

The result desired by using any of the above techniques is to fill the openings 24, 28 and provide aluminum having a relatively uniform depth above the level of the oxide layer 26 as shown in FIG. 5.

Figure 6:
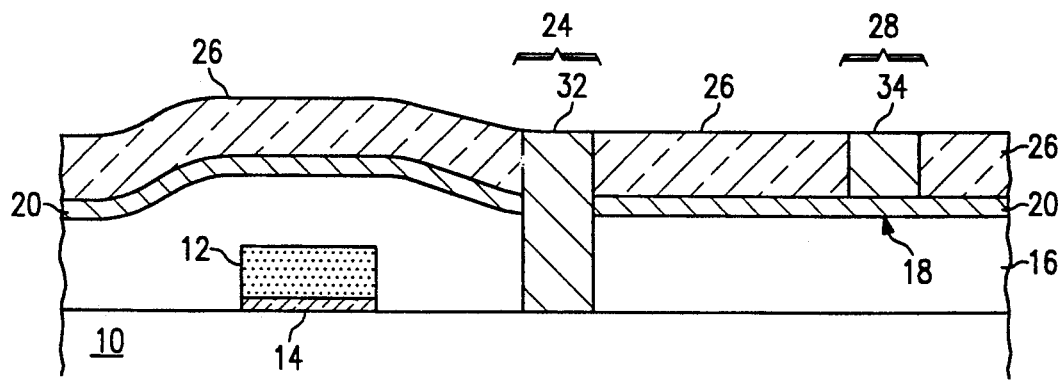

Referring to FIG. 6, the aluminum layer 30 is anisotropically etched back with a material which is selective for aluminum over oxide. The anisotropic etch is continued until the aluminum layer 30 has been removed down to the level of the oxide layer 26. At this point, aluminum remains in the opening 24 to form an aluminum contact 32 to the underlying region 10. Also, aluminum remains in the opening 28 to form an interconnect line 34 which lies on top of the metal oxide layer 20. Since the anisotropic etch is stopped when the aluminum has been removed down to approximately the layer of the oxide 26, the contact 32 and interconnect 34 have upper surfaces which are approximately coplanar with the upper surfaces of the surrounding oxide layer 26. In addition, they are now completely isolated and defined as a result of the masking step described in connection with FIGS. 3 and 4.

Figure 7:
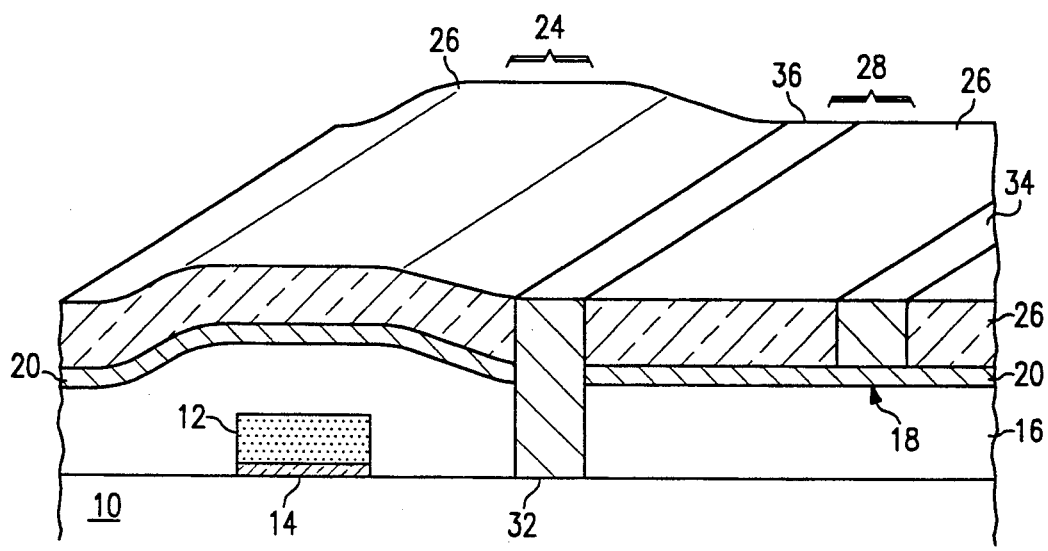
FIG. 7 is a perspective view showing completed interconnect lines.

FIG. 7 shows a perspective view of the structure shown in FIG. 6. The interconnect line 34 lies in the same plane as the oxide layer 26 and defines an interconnect signal line for that level. Contact plug 32 extends through the interlevel dielectric layer 16 to the layer of interconnect just formed. The contact 32 is not formed in isolation, but is formed as part of an interconnect signal line 36 which is similar to signal line 34. Since an unbroken aluminum region is formed from interconnect line 36 to conduct region 32, the contact resistance is low even if misalignment of the photoresist mask shown in FIG. 4 causes the contact region 32 to be somewhat smaller than the opening through the metal oxide layer 20.

Fabrication of the device continues using techniques known in the art from the point shown in FIG. 7. If desired, additional metal interconnect layers can be formed over the interconnect lines 34, 36 shown in FIG. 7. These layers can be formed using the techniques described above, if desirable. For example, an interlevel dielectric layer could be formed over the oxide layer 26, followed by a metal oxide layer. Since the interconnect formed by the technique described above is recessed into the surrounding oxide, no step problems occur and a relatively large number of interconnect levels can be formed.

With the technique described above, a complete aluminum fill of narrow signal lines, less than approximately 1.5 microns in width, is accomplished. With the technique described above, aluminum is formed above the recessed regions when the plug is filled. This prevents etching of the signal lines and contact region during the anisotropic etchback of the aluminum layer. However, if very wide signal lines are used, the thickness of the aluminum over them will be somewhat less. This will cause removal of part of the signal line itself during the anisotropic etchback step.

Figure 8:
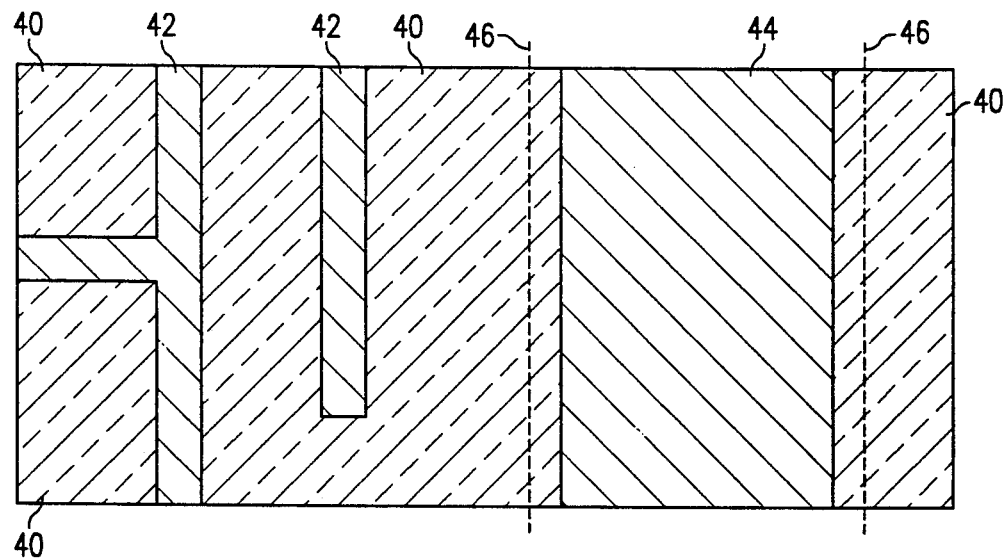
FIG. 8 is a planar view of a portion of an integrated circuit showing processing for wide metal lines and narrow metal lines.

FIG. 8 shows a plan view of a portion of an integrated circuit having small and large signal lines. Oxide regions 40 have been previously patterned to define interconnect regions. Narrow metal interconnect 42 is formed as described in FIGS. 1-7. A wide interconnect line 44 has also been defined. This wide interconnect line 44 is used for lines such as power supply buses and signal buses in the periphery of memory devices. In SRAM or DRAM memory devices, the wide signal lines 44 are typically required only in the periphery, with the narrower lines 42 being the only ones needed in the array of the device.

Since the anisotropic etchback step may remove more of the aluminum than is desired in the signal line 44, prior to performing such step a photoresist layer can be deposited and patterned to protect the wide signal lines. Dashed lines 46 show the region which is to be protected by the photoresist mask before the anisotropic etchback is performed. Forming this mask over the wide signal line prevents it from being etched while the etchback is performed. Preferably, the mask is formed with a few tenths of a micron of enclosure so that the signal line 44 is completely protected in the case of some mask misalignment. The etchback step will remove all aluminum outside of the lines 46, so there is no danger of shorting signal line 44 to some other line.

It will be appreciated by those skilled in the art that the method described above, and the structures formed thereby, provide for a relatively planarized metal interconnect layer which is relatively easy to fabricate. This technique provides an interconnect layer which can be easily used to form multiple levels of metal interconnect without creating severe topographic features which make formation of later interconnect levels difficult.

While the invention has been particularly shown and described with reference to a preferred embodiment, it will be understood by those skilled in the art that various changes in form and detail may be made therein without departing from the spirit and scope of the invention.

What is claimed is:

1. An interconnect structure for an integrated circuit, comprising:
   an interlevel dielectric layer overlying an underlying conductive structure;
   an insulating etch stop layer overlying said interlevel dielectric, said etch stop layer having openings in regions wherein contacts are to be formed;
   an insulator layer overlying said etch stop layer; a first plurality of patterned openings through said insulator layer to said etch stop layer, said openings filled with a conductive material; and
   a second plurality of patterned openings connected to said first patterned openings, said second openings aligned with the openings in said etch stop layer and extending through said interlevel dielectric layer to the underlying conductive structure, said second openings also filled with the conductive material.

2. The structure of claim 1, wherein upper surfaces of the conductive material in said first and second plurality of patterned openings are approximately coplanar with an upper surface of said insulator layer.

3. The structure of claim 1, wherein said etch stop layer comprises a layer of material which can be selectively etched over said interlevel dielectric layer, and which will not be significantly etched by an etchant used to etch said first and second openings through said interlevel dielectric layer and said insulator layer.

4. The structure of claim 3, wherein said etch stop layer comprises a metal oxide layer.

5. The structure of claim 3, wherein said etch stop layer comprises tantalum oxide.

6. The structure of claim 1, wherein the conductive material comprises metal.

7. The structure of claim 6, wherein the conductive material comprises aluminum.

8. The structure of claim 1, wherein said interlevel dielectric layer contains reflow glass or spin on glass.

9. A method for forming a contact on an integrated circuit device, comprising the steps of:
   forming a dielectric layer on the device and covering a conductive region;
   forming an insulating etch stop layer over the dielectric layer;
   etching selected portions of the etch stop layer to define openings therethrough;
   depositing an insulating layer over the etch stop layer and in the openings;
   etching selected portions of the insulating layer to define openings therethrough, wherein such openings are aligned with the etch stop layer openings, and wherein said insulating layer etching step further etches openings through the dielectric layer to expose portions of the conductive region; and
   depositing a conducting material in the openings through the interlevel dielectric, etch stop and insulating layers to form a contact region.

10. The method of claim 9, wherein the etch stop layer is formed from an insulating metal oxide.

11. The method of claim 9, wherein the etch stop layer is formed from silicon nitride.

12. The method of claim 9, wherein the conducting material comprises metal.

13. The method of claim 12, wherein the metal comprises aluminum.

14. The method of claim 9, wherein said conducting material depositing step comprises the steps of:
   depositing the conducting material so as to fill the openings and form a layer over the openings and the insulating layer; and
   etching the conducting material until the insulating layer is exposed, wherein the conductive material remains only in the openings.

15. A method for forming interconnect on an integrated circuit device, comprising the steps of:
   forming a dielectric layer on the device and covering a conductive region;
   forming an insulating etch stop layer over the dielectric layer;
   etching selected portions of the etch stop layer to define openings therethrough;
   depositing an insulating layer over the etch stop layer and in the openings;
   etching selected portions of the insulating layer to define openings therethrough, wherein a first set of such openings are aligned with the etch stop layer openings, and wherein a second set of such openings are not aligned with the etch stop layer openings, the first and second sets of openings together defining an interconnect pattern, and wherein said insulating layer etching step further etches openings through the dielectric layer underneath the etch stop layer openings to expose portions of the conductive region; and
   forming a conducting material in the first and second sets of openings to form a conductive interconnect layer and contacts to the conductive region.

16. The method of claim 15, wherein said conducting material forming step comprises the steps of:
   depositing the conducting material so as to fill the first and second sets of openings and form a layer over the openings and the insulating layer; and
   etching the conducting material until the insulating layer is exposed, wherein the conductive material remains only in the openings to define a conductive interconnect layer.

17. The method of claim 16, wherein the conducting material comprises metal.

18. The method of claim 17, wherein the conducting material comprises aluminum.

19. The method of claim 15, wherein the insulating layer comprises a metal oxide.

20. The method of claim 15, wherein the dielectric layer contains reflow glass or spin on glass.

* * * * *